(12) United States Patent
Wang

(10) Patent No.: US 10,943,906 B2
(45) Date of Patent: Mar. 9, 2021

(54) FINGERPRINT SENSING CHIP AND TERMINAL DEVICE

(71) Applicants: FOCALTECH ELECTRONICS, LTD., Grand Cayman (KY); Yunn-Hwa Wang, Guangdong (CN)

(72) Inventor: Yunn-Hwa Wang, Guangdong (CN)

(73) Assignee: FOCALTECH ELECTRONICS, LTD., Grand Cayman (KY)

( * ) Notice: Subject to any disclaimer, the term of this patent is extended or adjusted under 35 U.S.C. 154(b) by 0 days.

(21) Appl. No.: 16/345,251

(22) PCT Filed: Oct. 28, 2016

(86) PCT No.: PCT/CN2016/103790
§ 371 (c)(1),
(2) Date: May 21, 2019

(87) PCT Pub. No.: WO2018/076283
PCT Pub. Date: May 3, 2018

(65) Prior Publication Data
US 2019/0340404 A1    Nov. 7, 2019

(51) Int. Cl.
*G06K 9/00* (2006.01)
*H01L 27/10* (2006.01)
*G06F 3/044* (2006.01)

(52) U.S. Cl.
CPC ............ *H01L 27/101* (2013.01); *G06F 3/044* (2013.01); *G06K 9/0002* (2013.01)

(58) Field of Classification Search
CPC ...... G06K 9/0002; H01L 27/101; G06F 3/044
See application file for complete search history.

(56) References Cited

U.S. PATENT DOCUMENTS

| 2013/0271422 A1 | 10/2013 | Hotelling et al. |
| 2015/0248574 A1 | 9/2015 | Mrazek et al. |
| 2016/0026844 A1 | 1/2016 | Kim et al. |
| 2016/0092715 A1 | 3/2016 | Yazdandoost et al. |
| 2016/0092716 A1* | 3/2016 | Yazdandoost ........ G06K 9/0002 382/124 |
| 2016/0188949 A1 | 6/2016 | Yang |
| 2016/0239700 A1 | 8/2016 | Yang et al. |

(Continued)

FOREIGN PATENT DOCUMENTS

| CN | 103593077 A | 2/2014 |
| CN | 203480479 U | 3/2014 |

(Continued)

OTHER PUBLICATIONS

International Search Report for PCT/CN2016/103790 dated Jul. 3, 2017, ISA/CN.

(Continued)

*Primary Examiner* — Premal R Patel
(74) *Attorney, Agent, or Firm* — Yue(Robert) Xu; Apex Attorneys at Law, LLP

(57) ABSTRACT

A fingerprint sensing chip and a terminal device are provided. The fingerprint sensing chip includes a first signal, a second signal and a driving signal. The second signal is generated based on the first signal, and the driving signal is generated by performing a ground raise process on the second signal. The driving signal is used to provide a driving voltage for fingerprint sensing.

16 Claims, 3 Drawing Sheets

(56) References Cited

U.S. PATENT DOCUMENTS

2016/0358006 A1 12/2016 Zhan
2018/0082100 A1* 3/2018 Hsieh .................. G06K 9/2027

FOREIGN PATENT DOCUMENTS

| CN | 104268530 A | 1/2015 |
| CN | 104598894 A | 5/2015 |
| CN | 105302361 A | 2/2016 |
| CN | 105740756 A | 7/2016 |
| CN | 105893933 A | 8/2016 |
| CN | 205427873 U | 8/2016 |
| CN | 106022270 A | 10/2016 |

OTHER PUBLICATIONS

The 1st Office Action dated Dec. 31, 2020 for Chinese Application No. CN201680001397.3.
Eryun Liu, Frontiers of Computer Science in China, 5(2): 148-157, "Fingerprint segmentation based on an AdaBoost classifier", Jan. 14, 2011.
Ding Hui, Applications, "Domestic fingerprint recognition chip on smart phone"Application of IC, Aug. 31, 2014, pp. 32-34.

* cited by examiner

FINGERPRINT SENSING CHIP AND TERMINAL DEVICE

The present application is the national phase application of International Patent Application No. PCT/CN2016/103790 filed on Oct. 28, 2016, which is incorporated herein by reference in its entirety.

TECHNICAL FIELD

The present disclosure relates to the field of fingerprint sensing technology, and in particular to a power supply apparatus, a fingerprint sensing chip and a terminal device.

BACKGROUND

In the conventional art, some terminal devices, such as mobile phones, are equipped with a fingerprint sensing system to perform security authentication function of the terminal device during use by the user.

For example, there is a HOME button with an iron ring R in the fingerprint sensing system of an iPhone. Referring to FIG. 1, a first chip IC1 is connected to the iron ring R, and the IC1 controls the driving signal of the iron ring R. IC1 has two operating voltages, A and B respectively. A is used to supply power to a digital circuit, and B is used to supply power to an analog circuit. A and B may be outputted as square wave signals as shown in FIG. 2, but are not limited thereto. In FIG. 2, the voltage of B is higher than that of A. For example, VDD2 is 3V and VDD1 is 1.8V. B may also be used to drive the iron ring R. In general, both VSS1 and VSS2 are connected to the ground GND of the system.

In order to improve the accuracy of fingerprint sensing, the voltage of VDD2 should be as high as possible. However, an over-high voltage driving the iron ring R may cause discomfort of the user touching the HOME button. Therefore, in order to ease the discomfort of the user using fingerprint to unlock, a driving mode of ground raise is introduced in the conventional art.

In the driving mode of ground raise, IC1 does not work at a fixed voltage, and a second chip IC2 is introduced. As shown in FIG. 3, IC2 has voltages of A, B and C. IC2 further generates a square wave signal having voltages between VDD3 and VSS3 of C. The square wave signal is as shown in D in FIG. 2 and is used as VSS of IC1. This is the so-called ground raise, that is, the ground of IC1 is raised by the voltage of IC2. Before ground raise, the ground of IC1 is the ground GND of the system. In this case, the iron ring R can be connected to the ground GND of the system. Alternatively, the iron ring R may be cancelled. The user will not feel uncomfortable when touching the HOME button.

However, with the development of technology and the increase of user requirements, the volume of a terminal device is getting smaller and smaller, which requires higher and higher integration. Since the chips for fingerprint sensing shown in FIG. 3 includes the first chip IC1 and the second chip IC2, it can be understood that in manufacturing, the two chips requires two packaging processes, having a low integration and a high cost. Furthermore, the space occupied by the two chips is relatively large, which does not meet the light and thin trend of printed circuit boards.

SUMMARY

According to the present disclosure, a power supply apparatus, a fingerprint sensing chip and a fingerprint sensing device are provided, which can perform the function of ground raise, while improving the integration and reducing the volume of the circuit.

The present disclosure provides a fingerprint sensing chip, including a first signal, a second signal and a driving signal. The second signal is generated based on the first signal, and the driving signal is generated by performing a ground raise process on the second signal. The driving signal is used to provide a driving voltage for fingerprint sensing.

Preferably, the fingerprint sensing chip also includes a third signal. The third signal is generated based on the first signal.

Preferably, the driving signal is obtained by performing a positive ground raise process on the second signal.

Preferably, a voltage of the third signal ranges from 0 to a first positive voltage, a voltage of the first signal ranges from 0 to a second positive voltage, and a voltage of the second signal ranges from 0 to a third positive voltage. A low level of the driving signal is equal to a level of the second signal, and a high level of the driving signal is higher than the low level of the driving signal by a predetermined voltage.

Preferably, the third signal, the second signal, the driving signal and the first signal share a P-type substrate. The P-type substrate is connected to ground GND of the fingerprint sensing chip.

Preferably, the driving signal is obtained by performing a negative ground raise process on the second signal.

Preferably, a voltage of the third signal ranges from 0 to a first positive voltage, a voltage of the first signal ranges from 0 to a second positive voltage, and a voltage of the second signal ranges from 0 to a negative voltage. A low level of the driving signal is equal to a level of the second signal, and a high level of the driving signal is higher than the low level of the driving signal by a predetermined voltage.

Preferably, the third signal, the second signal, the driving signal and the first signal share a P-type substrate. The P-type substrate is connected to a low level of the driving signal, and a voltage of the P-type substrate varies with a voltage of the driving signal.

Preferably, the third signal, the second signal and the driving signal are all periodically varying signals.

Preferably, the third signal, the second signal and the driving signal are all square wave signals having same periods and same frequencies.

According to embodiments of the present disclosure, a terminal device is also provided, including a power supply and the fingerprint sensing chip according to any of claims 1 to 10. The power supply is configured to provide power to the fingerprint sensing chip. The fingerprint sensing chip is configured to sense a fingerprint.

Compared with the conventional art, the embodiments in the present disclosure has the advantages that, in the fingerprint sensing chip provided in the embodiments, the first chip and the second chip in the conventional art are integrated into one chip, thereby reducing the complexity of producing two chips, reducing the area occupied by the entire circuit, and meeting the requirements of user for thinner and lighter terminal device. Moreover, in the fingerprint sensing chip, the ground of the driving voltage of fingerprint sensing is raised, so as to eliminate discomfort of the user using fingerprint to perform the security authentication function of the terminal device.

BRIEF DESCRIPTION OF THE DRAWINGS

In order to explain more clearly the embodiments of the present disclosure or the technical solutions in the conventional art, following is a brief introduction to the accompanying drawings used in the embodiments or the technical descriptions of the conventional art. Apparently, the drawings described below are only some embodiments of the present disclosure, and for those skilled in the field, other drawings can also be obtained from these drawings without any creative effort.

DETAILED DESCRIPTION OF THE EMBODIMENTS

Following is a clear and complete description of the technical solutions of the present disclosure with reference to the accompanying drawings in the present disclosure. Apparently, the described embodiments are only some rather than all of the embodiments of the present disclosure. Based on the embodiments of the present disclosure, all other embodiments obtained by the skilled in the art without any creative effort fall within the scope of the present disclosure.

In order to make the purposes, features and advantages of the present disclosure mentioned above more clear and understandable, following is a detailed description of the specific embodiments of the present disclosure made with the accompanying drawings.

In the present disclosure, a fingerprint sensing chip is provided, which perform the function of ground raise by one chip to realize the fingerprint sensing.

Figure 1:
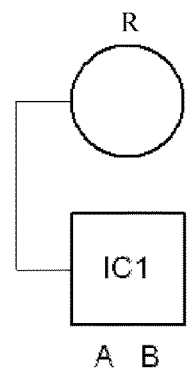
FIG. 1 is a schematic diagram of a first chip driving an iron ring in the conventional art.
Figure 2:
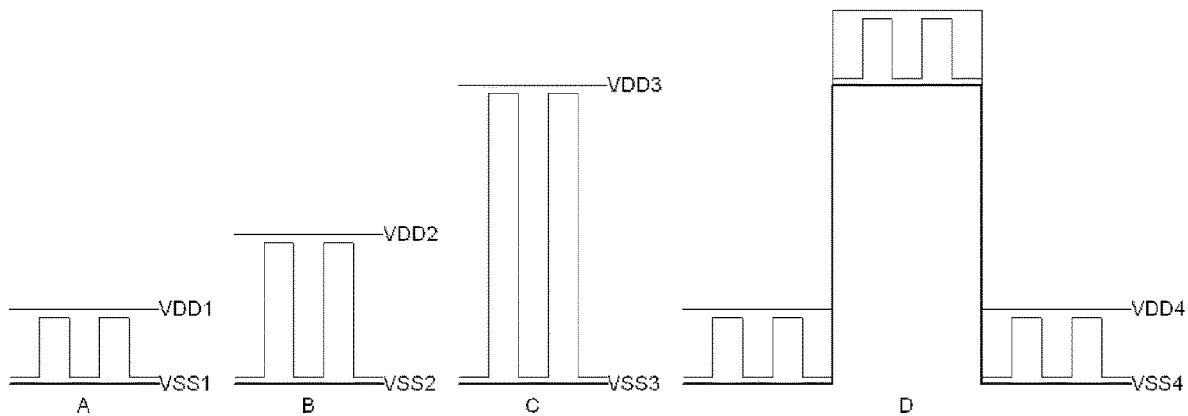
FIG. 2 is a schematic diagram of a voltage subjected to a ground raise process in the conventional art.
Figure 3:
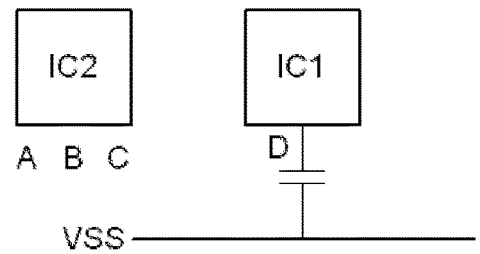
FIG. 3 is a schematic diagram of a chip for fingerprint sensing in the conventional art.
Figure 4:
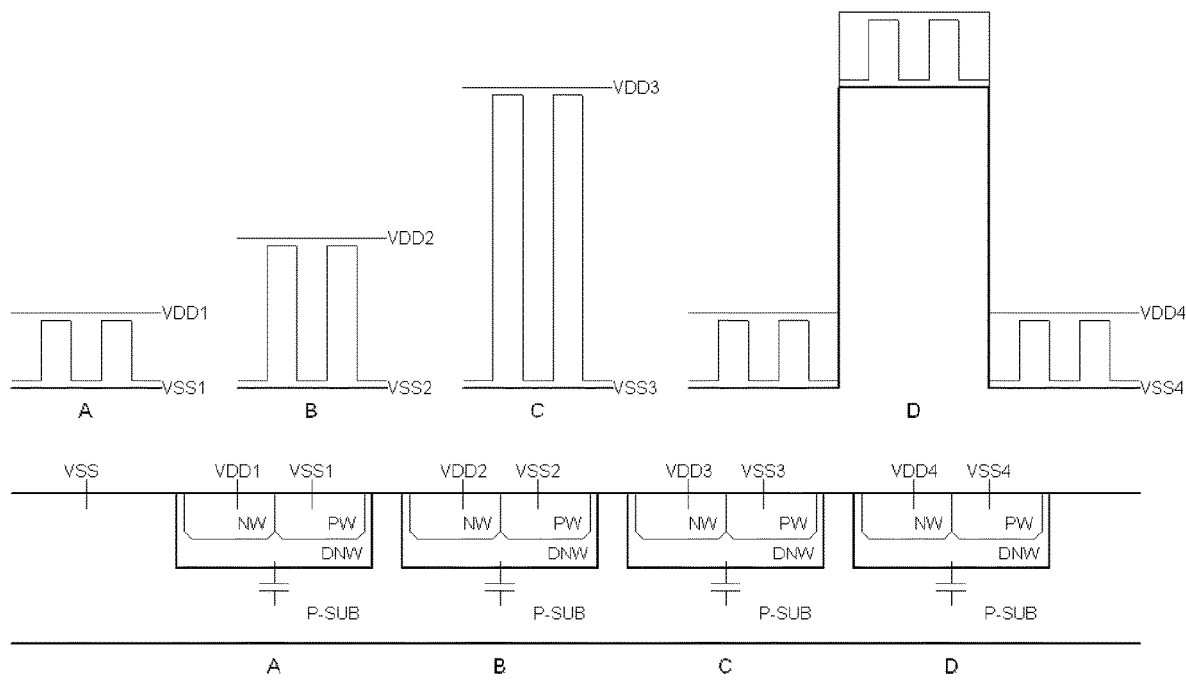
FIG. 4 is a schematic diagram of a fingerprint sensing chip according to a first embodiment of the present disclosure.

FIG. 4 is a schematic diagram of a fingerprint sensing chip according to a first embodiment of the present disclosure.

The fingerprint sensing chip provided by the present embodiment includes a first signal B, a second signal C, and a driving signal D. The second signal C is generated based on the first signal B. The driving signal D is generated by performing a ground raise process on the second signal C. The driving signal D is used to provide a driving voltage for fingerprint sensing.

B, C and D of the fingerprint sensing chip may be the voltage signals as shown in FIG. 4, but are not limited thereto.

VDD2 is a DC (direct current) potential, and a simulation circuit operates between VDD2 and VSS2, as shown in the signal B of in FIG. 4.

Generally, VDD2 is obtained from an external power supply for the entire IC. VDD1 is a low potential generated by a buck circuit in the IC. VDD3 is generated by a booster circuit based on VDD2, as shown in the signal C in FIG. 4.

A driver signal is provided to switch between VDD3 and VSS3, forming a square waveform, which is used as the power ground VSS4 of the circuit in the ground raise area, as shown in the signal D in FIG. 4.

It should be noted that the fingerprint sensing chip may also include a third signal A, as the signal A shown in in FIG. 4, where VDD1 is a DC (direct current) potential and a digital circuit operates between VDD1 and VSS1.

Alternatively, the fingerprint sensing chip may exclude the third signal A.

A circuit operating with the power supply A as shown in FIG. 4, has a component structure of VSS1 connected to a PW (P-well), VDD1 connected to a NW (N-well), and a DNW (deep N-well) provided under PW (P-well) and NW (N-well).

A circuit operating with the power supply B as shown in FIG. 4, has a component structure of VSS2 connected to a PW (P-well), VDD2 connected to a NW (N-well), and a DNW (deep N-well) provided under PW (P-well) and NW (N-well).

A circuit operating with the power supply C as shown in FIG. 4, has a component structure of VSS3 connected to a PW (P-well), VDD3 connected to a NW (N-well), and a DNW (deep N-well) provided under PW (P-well) and NW (N-well).

A circuit operating with the power supply D as shown in FIG. 4, has a component structure of VSS4 connected to a PW (P-well), VDD4 connected to a NW (N-well), and a DNW (deep N-well) provided under PW (P-well) and NW (N-well).

Circuits of different power domains A, B, C and D are isolated from each other by respective DNWs (deep N-well) and are all formed on a P-type substrate (P-SUB).

The P-type substrate P-SUB in this embodiment is connected to the ground GND of the fingerprint sensing chip.

The driving signal D is used to raise, by a positive voltage, the ground of the circuit module which needs ground raise.

As shown in FIG. 4, D is the voltage subjected to the ground raise process, and the ground raise mode is a positive ground raise mode. That is, the voltage is raised to the positive direction, and the ground raise voltage is a positive voltage greater than 0.

The voltage of the second signal C ranges from 0 to a third positive voltage VDD3.

In FIG. 4, VSS1=VSS2=VSS3=0, where VSS1 is the low level of A, VSS2 is the low level of B, and VSS3 is the low level of C.

The low level of the driving signal D is equal to a level of the second signal C, and the high level VDD4 of the driving signal is higher than the low level VSS4 of the driving signal by a predetermined voltage.

It is understood that the predetermined voltage difference between VDD4 and VSS4 may be determined according to actual needs.

In addition, the voltages of VDD1, VDD2 and VDD3 may be determined according to actual needs. For example, the waveform of C may be generated using a charge pump circuit or a switching power supply circuit.

A, B, C, and D are all integrated on one chip, that is, the four voltages share a substrate P-SUB in fabrication. The substrate P-SUB is connected to the lowest potential of the system, that is, the ground GND of the system. As can be seen in FIG. 4, the P-SUB is connected to VSS. It is understood that the GND of the system is fixed. Therefore, VSS=VSS1=VSS2=VSS3=VSS4=GND in FIG. 4.

Thus, the potentials corresponding to A, B, and C in FIG. 4 are all fixed.

In the fingerprint sensing chip provided in the embodiment, the first chip and the second chip in the conventional art are integrated into one chip, thereby reducing the area occupied by the entire circuit, and meeting the requirements of users for thinner and lighter terminal device. Moreover, in the fingerprint sensing chip, the ground of the driving voltage of fingerprint sensing is raised, so as to eliminate the discomfort of the user using fingerprint to perform the security authentication function of the terminal device.

However, the potential of the deep well (DNW, Deep N Well) isolation layer corresponding to D is equal to VDD4 in FIG. 4, that is, the potential of DNW in D changes with the voltage subjected to the ground raise process. As shown in FIG. 4, when VDD4 changes, DNW also changes, but the potential of P-SUB in D is fixed at VSS.

That is, the potential of DNW in D always fluctuates, but the potential of P-SUB in D is fixed, which will cause continuous charging and discharging of the junction capacitor between DNW and P-SUB in D.

In addition, different from A, B and C, D is provided to a fingerprint sensor array (FSA). Therefore, the circuit corresponding to D occupies most of the area of the chip. Thus, the capacitance of the junction capacitor generated by the fingerprint chip with the structure as in FIG. 4 is relatively large. For a power supply, the junction capacitor is a load that cannot be ignored. In a case of a large capacitance of the junction capacitor, considering the speed of charging and discharging, the loss is increased under a large voltage, and the raised voltage is likely to be pulled down. Therefore, for a large sensor array, the problem caused by the junction capacitor is serious.

Figure 5:
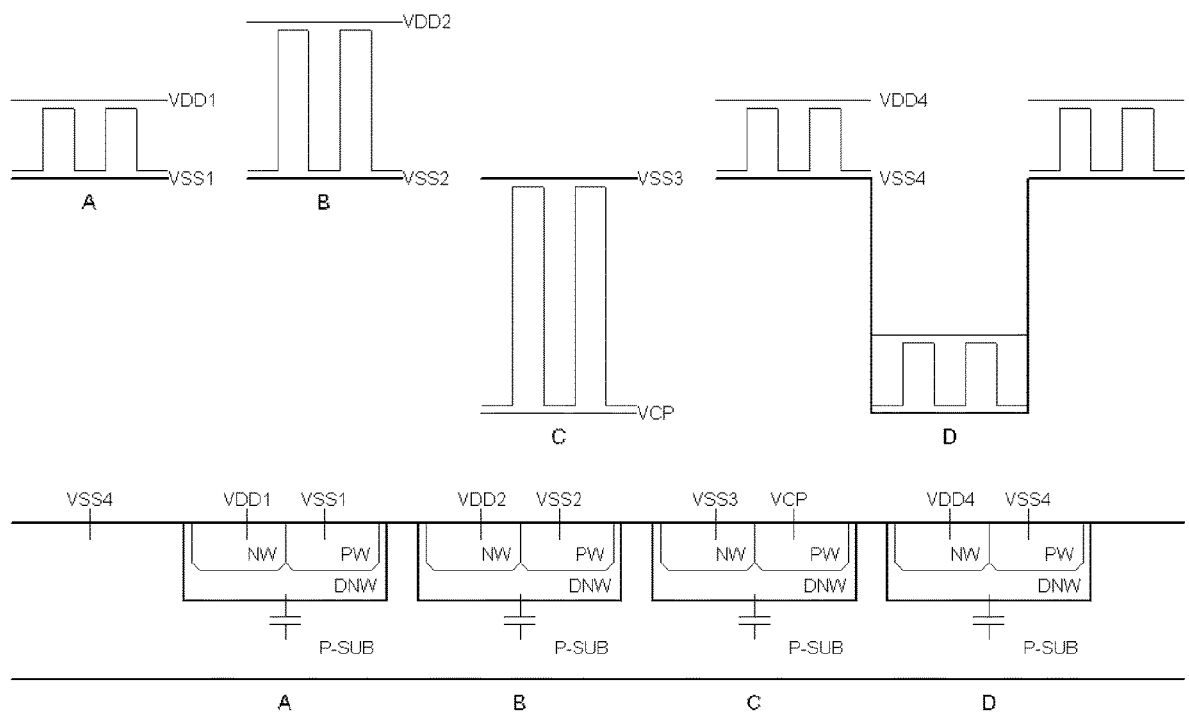
FIG. 5 is a schematic diagram of a fingerprint sensing chip according to a second embodiment of the present disclosure.

Therefore, in order to solve the problem of repeated charging and discharging of the junction capacitor in a single chip, a negative voltage ground raise mode is provided for the fingerprint sensing chip, based on the positive voltage ground raise mode provided in the above embodiments. FIG. 5 is a schematic diagram of a second embodiment of the fingerprint sensing chip provided in the present disclosure. The principle of the second embodiment of the fingerprint sensing chip is explained in detail with reference to FIG. 5.

As shown in FIG. 5, in the fingerprint sensing chip provided in the present embodiment, the driving signal D is obtained by perform a negative ground raise process on the second signal C.

A voltage of the third signal A ranges from 0 to a first positive voltage VDD1. A voltage of the first signal B ranges from 0 to a second positive voltage VDD2. A voltage of the second signal C ranges from 0 to a negative voltage VCP. A low level of the driving signal D is equal to a level of the second signal C, and a high level VDD4 of the driving signal is higher than the low level VSS4 of the driving signal by a predetermined voltage.

It is understood that, the predetermined voltage difference between VDD4 and VSS4 may be determined according to actual needs.

In addition, the voltages of VDD1, VDD2 and VDD3 may also be determined according to actual needs. For example, the waveform of C may be generated using a charge pump circuit or a switching power supply circuit based on the signal B.

The third signal A, the second signal C, the driving signal D and the first signal B share a P-type substrate. The P-type substrate is connected to the low level of the driving signal, and the voltage of the P-type substrate varies with a voltage of the driving signal.

The P-type substrate P-SUB is connected to the low level VSS4 of D, and the voltage of the P-type substrate P-SUB varies with the voltage of the second signal C.

As can be seen from FIG. 5, P-SUB in D is equal to VSS4, while DNW in D is equal to VDD4, that is, when P-SUB fluctuates with VSS4, DNW fluctuates synchronously with VDD4. The fluctuation amplitudes of VDD4 and VSS4 are the same, so that the voltage difference between P-SUB and DNW is fixed. Thus, the junction capacitor between P-SUB and DNW is not repeatedly charged and discharged, thereby reducing the power consumption.

In addition, there is a certain voltage fluctuation between the P-SUB and the corresponding DNW in A, B and C in FIG. 5. Taking A as an example, the voltage of P-SUB is the same as VSS4, but the voltage of DNW is the same as VDD1, where VDD1 is fixed, and VSS4 fluctuates. Thus, the junction capacitor formed between the P-SUB in A and the DNW in A may be charged and discharged. However, in the chip, since the circuits corresponding to A, B, and C occupy a small area while the circuit corresponding to D occupies a large area, the present embodiment has advantageous of eliminating the great hazard caused by repeated charging and discharging of the junction capacitor in D.

It should be noted that the sensing chip provided in the present embodiment can solve the technical problem as shown in FIG. 4 by adopting a negative ground raise mode. Since the P-SUB is connected to the lowest voltage in the system, when there is a negative high voltage, the lowest voltage in the system is not the ground GND of the system, but the negative high voltage. In this case, the P-SUB may be connected to the negative high voltage. Since the negative high voltage is a fluctuating modulation signal, the voltage of the P-SUB also fluctuates. In addition, since DNW in D is the same as the fluctuating VDD4, the relative voltage between P-SUB and DNW in D is fixed. Even if there is a junction capacitor, since there is no voltage difference between the two ends of the junction capacitor, the junction capacitor will not be repeatedly charged and discharged.

In the present embodiment, the components structures of circuit A, B, C and D in FIG. 5 are the same as that in FIG. 4.

It is understood that, in the above embodiments or other embodiments, the third signal may be a periodically changing signal. The third signal may be a square wave signal. The second signal may also be a square wave signal.

As can be seen in FIG. 5, preferably, the square waves of the third signal and the second signal have same periods and frequencies.

Based on the fingerprint sensing chip provided in the above embodiment, a terminal device is further provided according to an embodiment of the present disclosure, which includes a power supply and the fingerprint sensing chip described in the above embodiment.

The power supply is configured to provide power to the fingerprint sensing chip.

It is understood that, the voltage supplied by the power supply to the fingerprint sensing chip may be the first signal.

It is understood that, the fingerprint sensing chip may be applied to a terminal device, such as a mobile phone, to support the fingerprint unlock function for the user of the mobile phone. The driving voltage corresponding to D may provide a driving signal for fingerprint sensing.

Figure 6:
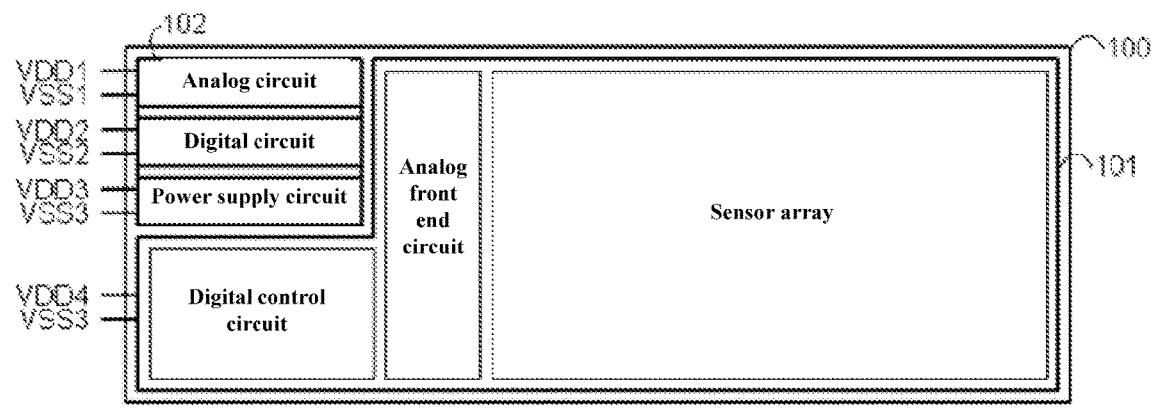
FIG. 6 is a schematic block diagram of a fingerprint sensing chip according to the present disclosure.

A schematic diagram of modules of the fingerprint sensing chip is shown in FIG. 6.

It should be noted that the power supply in FIG. 6 provides the voltages corresponding to A, B, C and D in FIG. 4 or FIG. 5.

Fingerprint sensing chip 100 includes a fingerprint identification circuit 101 and a power supply circuit 102.

The fingerprint identification circuit 101 includes a sensor array, an analog front end (AFE) circuit, and a digital control circuit.

The power supply circuit 102 includes four power supplies: VDD1 and VSS1, VDD2 and VSS2, VDD3 and VSS3, and VDD4 and VSS4.

VDD1 and VSS1 are used to supply power to the digital circuit. VDD2 and VSS2 are used to supply power to the analog circuit. VDD3 and VDD4 are high voltages or negative voltages outputted by converting the voltage VDD2. VDD4 and VSS4 are used to supply power to the fingerprint identification circuit 101.

As can be seen from FIG. 6, the fingerprint sensing chip provided by the present disclosure realizes the functions of IC1 and IC2 in the conventional art, in which the two chips are integrated into one chip which occupies less space, making the whole device smaller in size, and meeting the user's requirements for miniaturization.

The above only describes some preferred embodiments of the present disclosure, which should not be taken as limitation to the present disclosure. Although the technical solution has been described above with the preferred embodiments, it is not intended to limit the present disclosure. Any skilled in the art, without departing from the scope of the technical solutions of the present disclosure, may make many possible changes and modifications to the technical solutions of the present disclosure by using the methods and technical contents disclosed above, or modify them to the equivalent embodiments of equivalent changes. Therefore, any simple modifications, equivalent changes and modifications of the above embodiments according to the technical essence of the present disclosure, without departing from the contents of the technical solution of the present disclosure, are still within the scope of the protection of the present disclosure.

The invention claimed is:

1. A fingerprint sensing chip, comprising:
a first signal,
a second signal, and
a driving signal,
wherein the second signal is generated based on the first signal, and the driving signal is generated by performing a ground raise process on the second signal; and
the driving signal is used to provide a driving voltage for fingerprint sensing;
wherein:
the fingerprint chip further comprises a third signal;
the driving signal is obtained by performing a positive ground raise process on the second signal;
a voltage of the third signal ranges from 0 to a first positive voltage;
a voltage of the first signal ranges from 0 to a second positive voltage;
a voltage of the second signal ranges from 0 to a third positive voltage;
the third signal, the second signal, the driving signal and the first signal share a P-type substrate; and the P-type substrate is connected to ground GND of the fingerprint sensing chip;
the third signal is a low potential signal generated by a buck circuit in the fingerprint sensing chip; and
the second signal is generated by a booster circuit based on the first signal.

2. The fingerprint sensing chip according to claim 1, wherein the third signal, the second signal and the driving signal are all periodically changing signals.

3. The fingerprint sensing chip according to claim 2, wherein the third signal, the second signal and the driving signal are all square wave signals having same periods and same frequencies.

4. A terminal device, comprising:
a power supply, and
the fingerprint sensing chip according to claim 1,
wherein the power supply is configured to supply power to the fingerprint sensing chip;
the fingerprint sensing chip is configured to sense a fingerprint.

5. The terminal device according to claim 4, wherein the third signal, the second signal and the driving signal are all periodically changing signals.

6. The terminal device according to claim 5, wherein the third signal, the second signal and the driving signal are all square wave signals having same periods and same frequencies.

7. A fingerprint sensing chip, comprising:
a first signal,
a second signal, and
a driving signal,
wherein the second signal is generated based on the first signal, and the driving signal is generated by performing a ground raise process on the second signal; and
the driving signal is used to provide a driving voltage for fingerprint sensing;
wherein the fingerprint chip further comprises a third signal;
the third signal is a low potential signal generated by a buck circuit in the fingerprint sensing chip; and
the second signal is generated by a booster circuit based on the first signal;
wherein the driving signal is obtained by performing a negative ground raise process on the second signal.

8. The fingerprint sensing chip according to claim 7, wherein
a voltage of the third signal ranges from 0 to a first positive voltage;
a voltage of the first signal ranges from 0 to a second positive voltage;
a voltage of the second signal ranges from 0 to a negative voltage; and
a low level of the driving signal is equal to a level of the second signal, and a high level of the driving signal is higher than the low level of the driving signal by a predetermined voltage.

9. The fingerprint sensing chip according to claim 7, wherein the third signal, the second signal, the driving signal and the first signal share a P-type substrate; and
the P-type substrate is connected to a low level of the driving signal, and a voltage of the P-type substrate varies with a voltage of the driving signal.

10. A terminal device, comprising:
a power supply, and
the fingerprint sensing chip according to claim 7,
wherein the power supply is configured to supply power to the fingerprint sensing chip;
the fingerprint sensing chip is configured to sense a fingerprint;
wherein the driving signal is obtained by performing a negative ground raise process on the second signal.

11. The terminal device according to claim 10, wherein
a voltage of the third signal ranges from 0 to a first positive voltage;
a voltage of the first signal ranges from 0 to a second positive voltage;
a voltage of the second signal ranges from 0 to a negative voltage; and
a low level of the driving signal is equal to a level of the second signal, and a high level of the driving signal is higher than the low level of the driving signal by a predetermined voltage.

12. The terminal device according to claim 10, wherein the third signal, the second signal, the driving signal and the first signal share a P-type substrate; and the P-type substrate is connected to a low level of the driving signal, and a voltage of the P-type substrate varies with a voltage of the driving signal.

13. The terminal device according to claim 10, wherein the third signal, the second signal and the driving signal are all periodically changing signals.

14. The terminal device according to claim 13, wherein the third signal, the second signal and the driving signal are all square wave signals having same periods and same frequencies.

15. The fingerprint sensing chip according to claim 7, wherein the third signal, the second signal and the driving signal are all periodically changing signals.

16. The fingerprint sensing chip according to claim 15, wherein the third signal, the second signal and the driving signal are all square wave signals having same periods and same frequencies.

\* \* \* \* \*